(12) United States Patent
Cho et al.

(10) Patent No.: US 7,693,682 B2
(45) Date of Patent: Apr. 6, 2010

(54) METHOD FOR MEASURING CRITICAL DIMENSIONS OF A PATTERN USING AN OVERLAY MEASURING APPARATUS

(75) Inventors: Jeong-Hee Cho, Hwaseong-si (KR); Hyun-Tae Kang, Anyang-si (KR); Jang-Hoon Kim, Yongin-si (KR); Ki-Hyun Chyun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 102 days.

(21) Appl. No.: 11/933,540

(22) Filed: Nov. 1, 2007

(65) Prior Publication Data

US 2008/0123108 A1 May 29, 2008

(30) Foreign Application Priority Data

Nov. 29, 2006 (KR) ...................... 10-2006-0119040

(51) Int. Cl.
*G01B 5/26* (2006.01)
(52) U.S. Cl. ....................................................... 702/156
(58) Field of Classification Search ................ 702/156; 356/512; 257/797; 716/19
See application file for complete search history.

(56) References Cited

U.S. PATENT DOCUMENTS

| 5,701,013 | A | 12/1997 | Hsia et al. |
| 6,936,931 | B2* | 8/2005 | Baek et al. ................... 257/797 |
| 2005/0193362 | A1* | 9/2005 | Phan et al. ..................... 716/19 |
| 2006/0050283 | A1* | 3/2006 | Hill ............................. 356/512 |

* cited by examiner

*Primary Examiner*—Tung S Lau
*Assistant Examiner*—Xiuquin Sun
(74) *Attorney, Agent, or Firm*—Volentine & Whitt, PLLC

(57) ABSTRACT

A method for measuring critical dimensions of a pattern using an overlay measuring apparatus is provided. The method includes setting a first scan range, inputting a step pitch for the overlay measuring apparatus, inputting X and Y coordinates of a point on a reticle, and inputting a size of the reference pattern. The method further includes inputting a position of the reference pattern, inputting a second scan range, measuring the size of the reference pattern, and inputting an ideal pattern size. The method still further includes measuring a size and a first Z-axial focus position of a top region of the reference pattern, storing the first Z-axial focus position, measuring a size of the selected pattern of the first wafer using stored reference information, and determining whether the size of the selected pattern is suitable relative to the ideal pattern size.

5 Claims, 3 Drawing Sheets

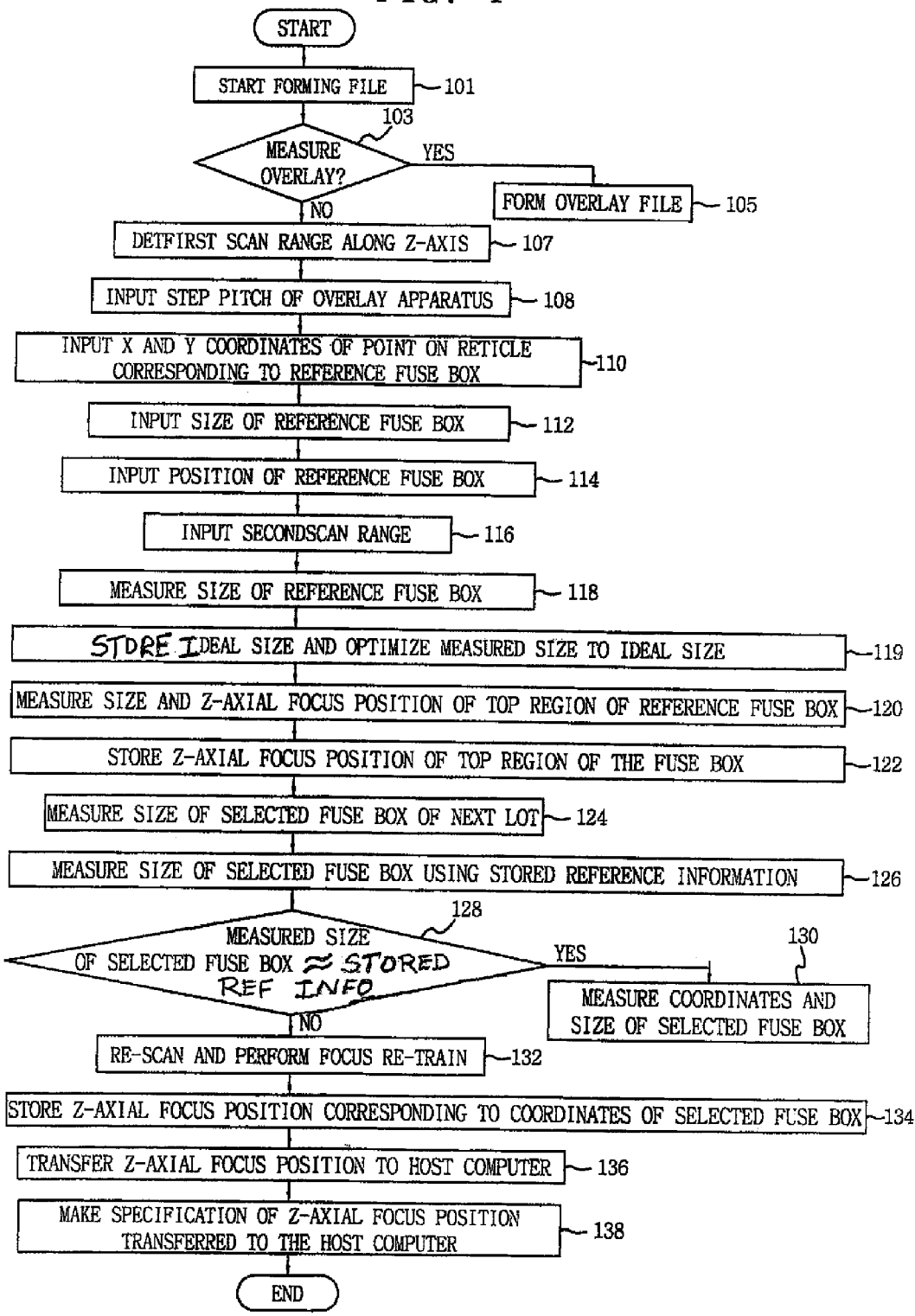

METHOD FOR MEASURING CRITICAL DIMENSIONS OF A PATTERN USING AN OVERLAY MEASURING APPARATUS

CROSS-REFERENCE TO RELATED APPLICATION

This application claims priority to Korean Patent Application No. 10-2006-0119040, filed Nov. 29, 2006, the subject matter of which is hereby incorporated by reference in its entirety.

BACKGROUND OF THE INVENTION

1. Field of the Invention

Embodiments of the invention relate to a method for fabricating a semiconductor memory device. In particular, embodiments of the invention relate to a method for measuring critical dimensions of a pattern using an overlay measuring apparatus.

2. Description of Related Art

In general, the fabrication of a semiconductor memory device comprises depositing materials to form thin films having various functions on a wafer surface and patterning the deposited materials to form various geometric circuit structures. Unit processes for the fabrication of a semiconductor memory generally include: an impurity ion implantation process for implanting impurity ions of Group 3B (for example, boron (B)) or 5B (for example, phosphorous (P) or arsenic (As)) into a semiconductor substrate, a thin film deposition process forming a material layer on a semiconductor substrate, and an etching process for forming the material layer into pattern. Additional unit processes include a process for depositing an interlayer insulating layer on a semiconductor substrate, a chemical mechanical polishing (CMP) process for planarizing the top surface of a wafer by polishing the wafer surface (after depositing the interlayer insulating layer) in order to get better step coverage (and the like) on the wafer, and a wafer and chamber cleaning process for removing impurities.

Semiconductor device technology has been advancing relatively quickly along with the relatively fast development of information and communications technologies and the relatively fast growth in the popularity of information technology media such as computers. Further, because semiconductor devices operating at relatively high speeds and having relatively high storage capacities are desired, the degree of integration of semiconductor devices progressively increases. In addition, as the degree of integration of semiconductor devices increases, the respective size of each element (i.e., unit element) of a semiconductor memory cell is gradually reduced. Accordingly, a multi-layer structure, in which all necessary patterns may be disposed in region having a limited area, is increasingly being used in achieving relatively high degrees of integration.

A double layer process and a stack transistor process are examples of processes that are widely used to form a multi-layer structure. The double layer process connects a number of metal layers using metal via contacts. The stack transistor process forms two or more transistors in a vertical structure on the same vertical line of a semiconductor substrate.

In a semiconductor memory device, the pattern density of a memory cell region of the device is much higher than the pattern density of a peripheral circuit region of the device. Thus, as the degree of integration of a semiconductor device increases, the step coverage of a material layer gets worse because of the step (i.e., difference in height) between adjacent patterns. Moreover, as the degree of integration of a semiconductor memory device increases, the resolution of a photolithography process deteriorates, making it relatively difficult to form a pattern with an accurate profile. In addition, as the degree of integration of a semiconductor device increases, insufficient process margins causes misalignment in the semiconductor device. Therefore, for a photolithography process, which is a core process in the fabrication of a semiconductor device, it is essential to check a degree of overlay (that is, the overlay extent) between a previously-formed lower pattern and an upper pattern to be formed in a present processing step and to accurately control critical dimensions of a pattern in accordance with the design rules in order to substantially reduce the misalignment between the patterns.

FIGS. 1A and 1B illustrate a conventional process for forming (i.e., opening) a fuse box. In FIG. 1A, a fuse pattern 12 is formed on an interlayer insulating layer 10 that was formed on a semiconductor substrate to form a relatively flat surface on (i.e., to planarize a top surface of) the semiconductor substrate. Fuse pattern 12 is a contact that transfers a voltage applied from the outside to an internal transistor and may be formed from a metal material such as, for example, aluminum or copper, and the like.

In addition, a non-photosensitive polyimide layer is formed on interlayer insulating layer 10 as a passivation layer 14 to protect fuse pattern 12. After photoresist (PR) is applied onto passivation layer 14, conventional exposure and development processes are performed to form a mask pattern 16 used in etching passivation layer 14.

Then, a conventional photolithography process is performed on the resultant structure on which mask pattern 16 has been formed. As a result, as illustrated in FIG. 1B, passivation layer 14 is etched such that a portion of a surface of fuse pattern 12 is exposed and a fuse box 18 is thereby formed.

When passivation layer 14 is a non-photosensitive polyimide layer, mask pattern 16 must be formed on passivation layer 14 in order to etch passivation layer 14. However, photosensitive polyimide (PSPI) may be used to form passivation layer 14 rather than the non-photosensitive polyimide. When PSPI is used to form passivation layer 14, mask pattern 16 does not need to be formed on passivation layer 14 in order to etch passivation layer 14. So, when PSPI is used to form passivation layer 14, passivation layer 14 may be etched without having to perform the process for forming mask pattern 16 using photoresist.

FIG. 2 illustrates a process for forming a fuse box using PSPI. In FIG. 2, an interlayer insulating layer 100 is formed on a semiconductor substrate (not shown) to form a relatively flat surface on a top surface of the semiconductor substrate on which a transistor is formed. A fuse pattern 102, which functions as a contact to transfer a voltage applied from the outside to an internal transistor, is formed on interlayer insulating layer 100. Fuse pattern 102 may be formed from a metal material such as, for example, aluminum or copper, and the like.

In addition, a PSPI layer is formed on interlayer insulating layer 100 and fuse pattern 102 as a passivation layer 104 to protect fuse pattern 102. Thereafter, passivation layer 104 is partially etched to form a fuse box 106 to expose fuse pattern 102.

When passivation layer 104 is a PSPI layer, passivation layer 104 may be etched without performing the additional process of forming a mask pattern on passivation layer 104. That is, because the PSPI layer functions as a photoresist, when passivation layer 104 is a PSPI layer, substantially the same result may be obtained by etching passivation layer 104 without applying photoresist as by performing a conventional photolithography process using the photoresist. FIGS. 1A and 1B illustrate a method for forming fuse box 18, wherein the method includes forming a non-photosensitive polyimide layer as passivation layer 14, forming mask pattern 16 from photoresist, and etching passivation layer 14 using mask pattern 16 to form fuse box 18. However, FIG. 2 illustrates a process for forming fuse box 18 that includes forming a PSPI layer as passivation layer 104, and forming fuse box 106 through one process of etching passivation layer 104 using a photolithography process. Therefore, the method illustrated in FIG. 2 comprises fewer processing steps than the method illustrated in FIGS. 1A and 1B. Also, the refresh characteristic is improved through low temperature hardening.

To perform the aforementioned processes for forming a fuse box, the size of the fuse box needs to be measured. A scanning electron beam microscope (SEM) is conventionally used to measure the size of the fuse box. However, when the passivation layer is a photosensitive polyimide layer, the SEM equipment generates fumes that inhibit the functionality of the SEM equipment.

SUMMARY OF THE INVENTION

Embodiments of the invention provide a method for measuring critical dimensions of a pattern using an overlay measuring apparatus so that a size of a fuse box may be measured more readily. In addition, embodiments of the invention provide a method for measuring critical dimensions of a pattern using an overlay measuring apparatus to reduce the amount of time required for measuring a size of a fuse box and to adjustably cope with a change in the size of the fuse box.

In one embodiment, the invention provides a method for measuring critical dimensions of a selected pattern formed on a first wafer using an overlay measuring apparatus. The method comprises setting a first scan range along a Z-axis for the overlay measuring apparatus by inputting to the overlay measuring apparatus information corresponding to a depth of a reference pattern formed on a second wafer; inputting to the overlay measuring apparatus a step pitch for the overlay measuring apparatus; inputting X and Y coordinates of a point on a reticle to the overlay measuring apparatus, wherein the reticle and the point correspond to the reference pattern; and inputting a size of the reference pattern to the overlay measuring apparatus. The method further comprises inputting to the overlay measuring apparatus a position of the reference pattern among a plurality of patterns formed on the second wafer; inputting a second scan range to the overlay measuring apparatus by inputting information corresponding to a thickness of a passivation layer formed on the second wafer, wherein the reference pattern is formed in the passivation layer; measuring the size of the reference pattern; and inputting an ideal pattern size to the overlay measuring apparatus. The method still further comprises measuring a size and a first Z-axial focus position of a top region of the reference pattern; storing the first Z-axial focus position in the overlay measuring apparatus; measuring a size of the selected pattern of the first wafer using stored reference information; and determining whether the size of the selected pattern is suitable relative to the ideal pattern size.

In another embodiment, the invention provides a method for measuring critical dimensions of a selected pattern formed on a first wafer using an overlay measuring apparatus, the method comprising determining whether to perform a general overlay measurement operation. In addition, the method comprises, when it is determined not to perform the overlay measurement operation, setting a first scan range along a Z-axis for the overlay measuring apparatus by inputting to the overlay measuring apparatus information corresponding to a depth of a reference pattern formed on a second wafer; inputting to the overlay measuring apparatus a step pitch for the overlay measuring apparatus; inputting X and Y coordinates of a point on a reticle to the overlay measuring apparatus, wherein the reticle and the point correspond to the reference pattern; and inputting a size of the reference pattern to the overlay measuring apparatus. The method further comprises, when it is determined not to perform the overlay measurement operation, inputting to the overlay measuring apparatus a position of the reference pattern among a plurality of patterns formed on the second wafer; inputting a second scan range to the overlay measuring apparatus by inputting information corresponding to a thickness of an insulating layer formed on the second wafer, wherein the reference pattern is formed in the insulating layer; measuring the size of the reference pattern; and inputting an ideal pattern size to the overlay measuring apparatus. The method still further comprises, when it is determined not to perform the overlay measurement operation, measuring a size and a first Z-axial focus position of a top region of the reference pattern; storing the first Z-axial focus position in the overlay measuring apparatus; measuring a size of the selected pattern of the first wafer using stored reference information; and determining whether the size of the second pattern is suitable relative to the ideal pattern size.

BRIEF DESCRIPTION OF THE DRAWINGS

Embodiments of the invention will be described herein with reference to the accompanying drawings, in which:

FIG. 4 is a flow chart of a method for measuring a size of the fuse box illustrated in FIG. 3 using an overlay measuring apparatus, in accordance with an embodiment of the invention.

DESCRIPTION OF EMBODIMENTS

Figure 1A:
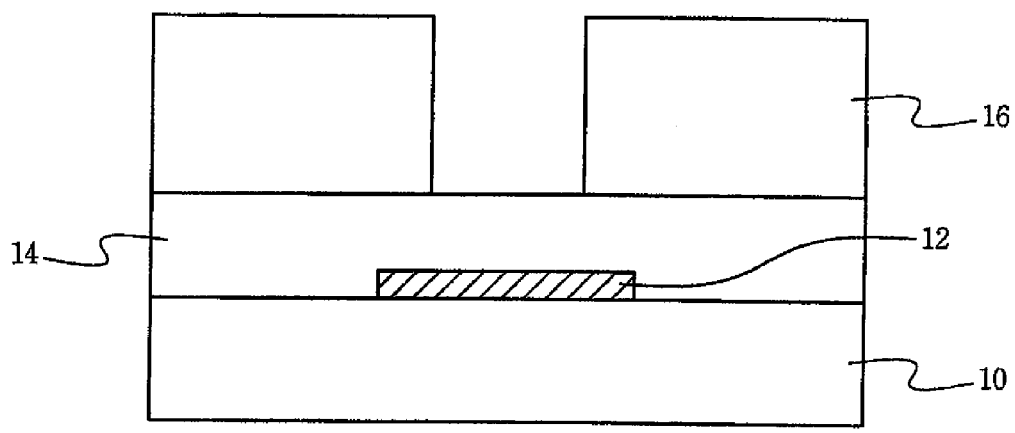
FIGS. 1A and 1B illustrate a conventional method for forming a fuse box.
Figure 1B:
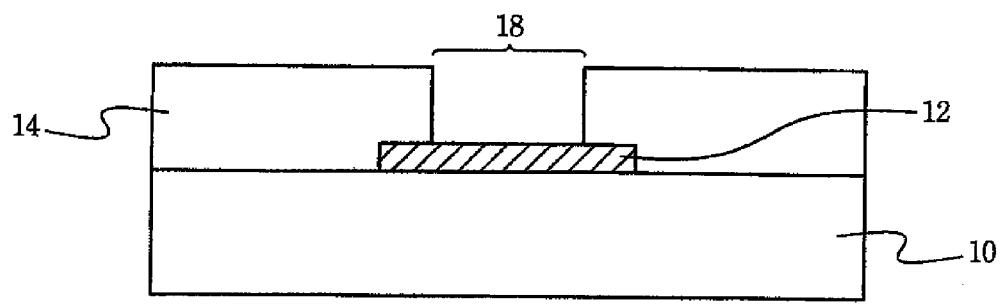
Figure 2:
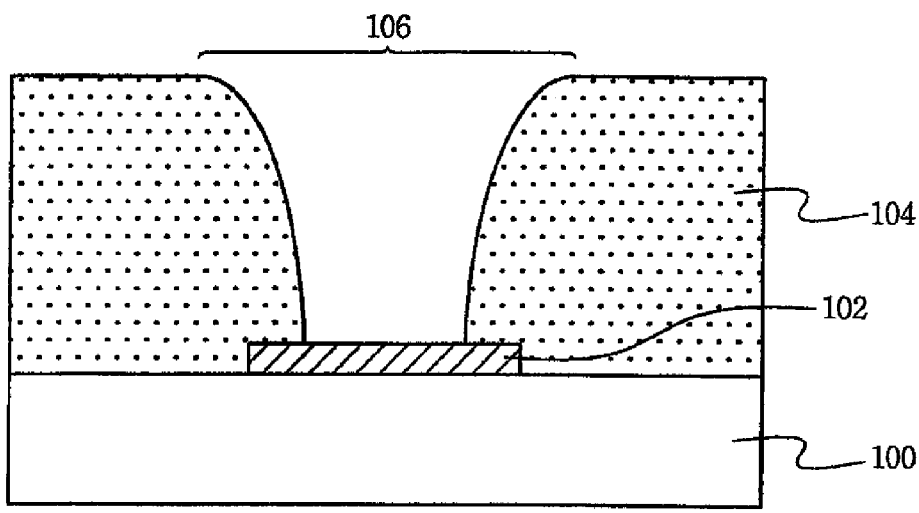
FIG. 2 illustrates another conventional method for forming a fuse box.

Semiconductor memory devices operating at relatively high speeds and having relatively high storage capacities are desired. Accordingly, advances in semiconductor memory devices are aimed at increasing the degree of integration of the semiconductor memory devices, and design rules are reduced as the degree of integration is increased. When a semiconductor memory device is fabricated using the unit processes mentioned above, as the degree of integration of a semiconductor device increases, the step coverage of a material layer is relatively poor because of the step (i.e., irregularity in height) between adjacent patterns, and the resolution of a photolithography process deteriorates. Thus, it is relatively difficult to form a pattern with an accurate profile. Moreover, insufficient process margins cause misalignment, which reduces the reliability of the semiconductor memory devices produced and decreases the yield of semiconductor memory device production.

As the capacity and integration density of semiconductor memory devices are increased, the respective size of each element (i.e., unit element) forming a memory cell is reduced and the process margin is reduced. Therefore, a multi-layer structure disposed in a region having a limited area and using the reduced process margin is being used to achieve a relatively high degree of integration. A double layer process or a stack transistor process, for example, may be used to form the multi-layer structure. The double layer process connects a number of metal layers to one another using a metal via contact. The stack transistor process forms two or more transistors in a vertical structure on the same vertical line of a semiconductor substrate. For example, since a static random access memory (SRAM) device has relatively low power consumption and a relatively high operating speed compared to other types of memories, it is widely used as a cache memory in a computer having relatively high performance relatively high storage capacity. However, the SRAM device has a relatively low integration density compared to other types of memories because one cell structure in the SRAM device has six transistors. Therefore, the aforementioned double layer process and the stack transistor structure, which is realized by stacking transistors in at least two or more layers, may be used beneficially.

When a process such as the double layer process or the stack transistor process is used in forming a semiconductor memory device having a relatively high degree of integration, a relatively high amount of accuracy is required in performing various unit processes of the process used.

For example, among the many unit processes used in fabricating a semiconductor memory device, an etching process is one of the main processes used in forming a material layer pattern (that performs various functions) on a surface of the wafer. An etching process is performed to remove unnecessary portions of a material layer disposed on a semiconductor substrate while leaving necessary portions of the material layer on the substrate. An etching process may be a wet etching process or a dry etching process. Wet etching is an etching process for patterning a material layer using a chemical solution. Dry etching is an etching process for patterning a material layer using gas plasma, an ion beam, or sputtering, but without using a chemical solution. However, as the degree of integration of a semiconductor device rapidly increases, the step (i.e., the difference in height) between unit regions where memory cells are formed increases, so an aspect ratio is increased and critical dimensions of a circuit pattern become much smaller to provide the semiconductor device with a relatively high degree of integration. Thus, dry etching is widely used because dry etching is capable of forming a pattern more precisely.

When a photolithography etching process using dry etching is used to transfer a pattern formed on a reticle (mask) to the surface of a wafer, the photolithography etching process comprises applying photoresist onto substantially all of an upper surface of a wafer, baking the wafer by applying heat to the wafer in order to maintain uniformity of the photoresist applied onto the wafer, and exposing portions of the photoresist in accordance with the pattern formed in the reticle (mask) by emitting light (such as ultraviolet light and the like) onto the portions of the photoresist. The photolithography etching process further comprises developing and removing the portions of the photoresist that were exposed to the light or the portions that were not exposed to the light using a chemical by spraying a developing solution onto the wafer, and measuring a developed state and the aligned state and testing whether any defects exist.

Specifically, in the testing step, an overlay measuring apparatus is used to determine whether a first pattern formed through a first photolithography process and a second pattern formed through a second photolithography process (performed after the first photolithography process) are aligned properly. It is necessary to check the degree of overlay (i.e., the overlay extent) between the first pattern (formed in a lower layer) and the second pattern (formed in an upper layer). As the degree of integration of a semiconductor memory device increases and the size of the semiconductor memory device decreases, the overlay between a lower layer and an upper layer is a critical factor affecting the yield of a semiconductor memory device fabrication process and the reliability of a semiconductor memory device fabricated through that process. The overlay between the lower and upper layers is typically measured by an overlay mark formed of an amin scale and a vernier scale. The overlay mark is generally formed on a scribe region so that it will not affect a memory cell region.

Further, in the testing step, both the critical dimension and the overlay are measured. The critical dimension is measured using an SEM to determine whether a width of the pattern transferred onto the wafer has been formed with a desired size.

However, when photosensitive polyimide is used in a process for forming a fuse box, the functionality of the SEM equipment is inhibited because of fumes generated by the photosensitive polyimide. Therefore, a method for effectively measuring a size of a fuse box using the overlay measuring apparatus is provided. A method for measuring critical dimensions of a pattern using the overlay measuring apparatus will now be described with reference to the drawings.

Figure 3:
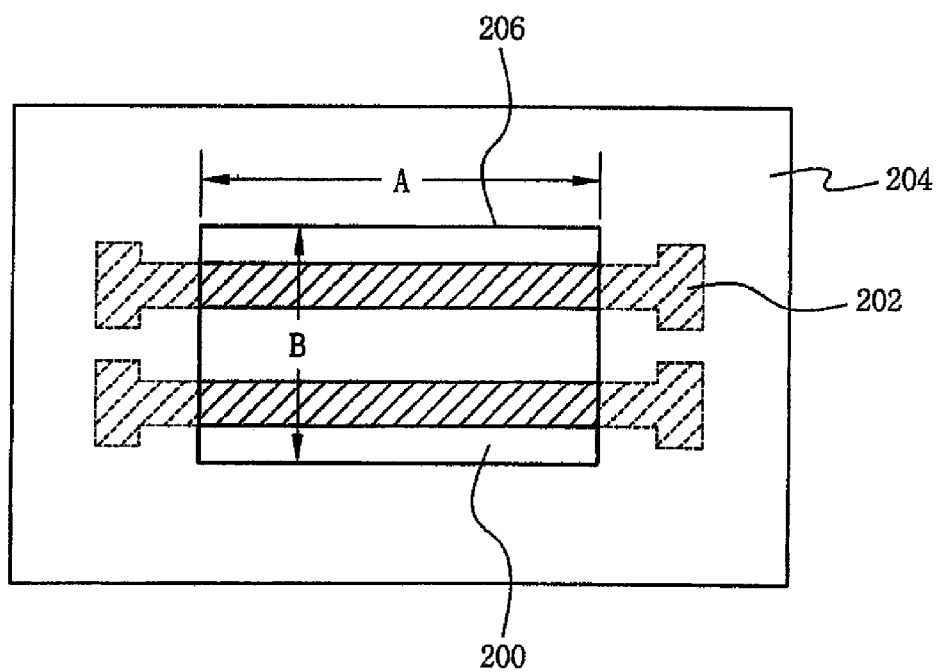
FIG. 3 illustrates a plan view of a fuse box.

FIG. 3 illustrates a plan view of a fuse box. A method for measuring the critical dimensions of a pattern using the overlay measuring apparatus will be described with reference to FIG. 3.

In FIG. 3, an interlayer insulating layer 200 is formed on a semiconductor substrate (not shown) to form a relatively flat surface on (i.e., to planarize) an upper surface of the semiconductor substrate, wherein a transistor (not shown) has been formed on the semiconductor substrate. A fuse pattern 202, which functions as a contact to transfer a voltage applied from the outside to the internal transistor, is formed on interlayer insulating layer 200. Fuse pattern 202 may be formed from a metal material such as, for example, aluminum or copper, and the like.

A passivation layer 204 is formed on interlayer insulating layer 200 and fuse pattern 202 to protect fuse pattern 202. A photosensitive polyimide (PSPI) layer may be formed as passivation layer 204 or a non-photosensitive polyimide layer may be formed as passivation layer 204. That is, passivation layer 204 may be a PSPI layer or a non-photosensitive polyimide layer. A fuse box 206 exposing fuse pattern 202 is formed in passivation layer 204. A fuse box may also be referred to herein as a "pattern".

After fuse box 206 exposing fuse pattern 202 is formed as illustrated in FIG. 3, the size of fuse box 206 is measured. That is, the width A of fuse box 206 and the length B of fuse box 206 are measured. When passivation layer 204 is a non-photosensitive polyimide layer, the size of fuse box 206 may be measured using conventional SEM equipment. However, when passivation layer 204 is a PSPI layer, fumes are generated, which inhibits the functionality of the conventional SEM equipment.

In accordance with an embodiment of the invention, a method for relatively accurately measuring the size of fuse box 206 when fuse box 206 has been formed in a passivation layer 204 that is a PSPI layer is provided. It is advantageous for the passivation layer to be a PSPI layer because, when the passivation layer is a PSPI layer, the process for forming a fuse box may be shortened compared to a process for forming a fuse box in a passivation layer that is a non-photosensitive polyimide layer. That is, a method for measuring the size of a fuse box using the overlay measuring apparatus instead of conventional SEM equipment is provided.

FIG. 4 illustrates a method for measuring the size of a selected fuse box 206 illustrated in FIG. 3 using an overlay measuring apparatus instead of the SEM, in accordance with an embodiment of the invention. The method also refers to a reference fuse box 206, which corresponds to selected fuse box 206 but is formed on a different wafer from the selected fuse box and is not shown in the drawings.

The method for measuring the critical dimensions of a selected pattern using the overlay measuring apparatus, in accordance with an embodiment of the invention, will now be described with reference to FIGS. 3 and 4.

In step 101, the formation of a file is started. In step 103, a determination of whether to measure overlay is made. That is, it is determined whether to perform a general overlay measurement operation. When it is determined in step 103 that measurement of overlay is desired, then, in step 105, a general overlay measurement operation is performed and the result of the overlay measurement operation is stored in a file (i.e., the file started in step 101).

When it is determined in step 103 that the measurement of critical dimensions is desired as opposed to the measurement of overlay, a first scan range corresponding to a reference fuse box 206 is set in the overlay measuring apparatus in step 107. The first scan range is a scan range along a Z-axis perpendicular to an upper surface of interlayer insulating layer 200. In addition, the first scan range extends from a height along the Z-axis that is even with an upper surface of passivation layer 204 (e.g., a photosensitive polymide layer 204) and an upper surface of fuse pattern 202. That is, the depth of reference fuse box 206 is input to the overlay measuring apparatus to set the first scan range along the Z-axis for the overlay measuring apparatus. The first scan range along the Z-axis may be set as 20 μm, for example. As mentioned previously, passivation layer 204 may be a PSPI layer or a non-photosensitive polymide layer.

Subsequently, a step pitch for the overlay measuring apparatus is input to the overlay measuring apparatus in step 108. In step 110, X and Y coordinates of a point on a reticle corresponding to reference fuse box 206 are input to the overlay measuring apparatus. The point on the reticle also corresponds to reference fuse box 206.

In step 112, the size (i.e., the length and width) of reference fuse box 206 is input to the overlay measuring apparatus. In step 114, the position of reference fuse box 206 among a plurality of fuse boxes 206 formed on a wafer is input to the overlay measuring apparatus.

In step 116, information about the thickness of passivation layer 204 is input to the overlay measuring apparatus as a second scan range. The second scan range extends along the Z-axis and extends between an upper surface of passivation layer 204 (i.e., a height along the Z-axis that is even with an upper surface of passivation layer 204) and an upper surface of interlayer insulating layer 200. In step 118, the size of reference fuse box 206 is measured. Subsequently, in step 119, an ideal size of a fuse box is input to the overlay measuring apparatus and the measured size of reference fuse box 206 is optimized to the ideal size. The ideal size for a fuse box is an ideal numerical value range for the size of a fuse box and may be referred to herein as "conditions for a good product", an "ideal fuse box size", or an "ideal pattern size". When fuse boxes have the ideal size, a relatively high yield of semiconductor devices comprising the fuse boxes having the ideal size may be expected. The stored size of reference fuse box 206 is optimized to the conditions for a good product (i.e., the ideal size for reference fuse box 206). The size of reference fuse box 206 is preferably within the conditions for a good product (i.e., within the ideal range). However, the size of reference fuse box 206 may have a margin (i.e., may be outside of the conditions for a good product). In step 120, the size and the Z-axial focus position of the top region of reference fuse box 206 is measured. In step 122, the Z-axial focus position of the top region of reference fuse box 206, which was measured in step 120, is stored in the overlay measuring apparatus. As used herein, a "Z-axial focus position" corresponding to a fuse box is the position of the top region of the fuse box along the Z-axis.

In step 124, the size of a selected fuse box of a wafer of a next lot is measured. In step 126, the size of the selected fuse box of the next lot is measured using the reference information stored in steps 107 through 122, which may be referred to herein as "stored reference information".

In step 128, it is determined whether the size of the selected fuse box measured in step 126 is suitable for the conditions of a good product. If it is determined in step 128 that the size of the fuse box is suitable for the conditions of a good product, then, in step 130, the coordinates of the selected fuse box satisfying the conditions of a good product are measured and the size of the selected fuse box disposed at the measured coordinates is measured.

However, if it is determined in step 128 that the size of the fuse box is not suitable relative to the conditions for a good product, then, at step 132, re-scanning is performed and focus re-training is performed. Performing re-scanning and focus re-training means performing steps 107 through 122 again. Then, in step 134, the Z-axial focus position corresponding to the coordinates of the selected fuse box is stored and checked by an engineer.

In step 136, the Z-axial focus position corresponding to the coordinates of the selected fuse box is transferred to a host computer. In step 138, a specification is made that contains the Z-axial focus position corresponding to the coordinates of the selected fuse box.

In accordance with an embodiment of the invention, an overlay measuring apparatus, rather than SEM equipment, is used to measure the size of a fuse box, that is, the size of an opening defined by the fuse box. When measuring the size of the fuse box using the overlay measuring apparatus, the size of the fuse box may be measured accurately even after shortening the process for forming the fuse box by using a photosensitive polyimide layer. That is, even when photosensitive polyimide is used as the passivation layer to protect a pad pattern, the size of the fuse box may be readily and relatively accurately measured using the overlay measuring apparatus. Therefore, the time and effort spent measuring the fuse box may be reduced. In addition, the productivity of a process for fabricating semiconductor memory devices having fuse boxes formed using a photosensitive polymide layer, and the reliability of the semiconductor memory devices produced may be improved.

Although embodiments of the invention have been described herein, modifications may be made to those embodiments by one skilled in the art without departing from the scope of the invention as defined by the accompanying claims.

What is claimed is:

1. A method for measuring critical dimensions of a selected fuse pattern formed on a first wafer using an overlay measuring apparatus, wherein the selected fuse pattern is exposed through a passivation layer formed from a photosensitive polyimide layer, and the method comprising:

setting a first scan range in the overlay measuring apparatus corresponding to a reference fuse pattern formed on a second wafer, wherein the first scan range is a scan range along a Z-axis perpendicular to an upper surface of an interlayer insulating layer of the second wafer on which the reference fuse pattern is formed;

inputting to the overlay measuring apparatus a step pitch for the overlay measuring apparatus, X and Y coordinates of a point on a reticle to the overlay measuring apparatus, wherein the reticle and the point correspond to the reference fuse pattern, a size of the reference fuse pattern, and a position of the reference fuse pattern among a plurality of fuse patterns formed on the second wafer;

setting a second scan range in the overlay measuring apparatus corresponding to a thickness of the passivation layer formed on the interlayer insulating layer of the second wafer;

measuring a size for the reference fuse pattern in relation to the first ands second scan ranges;

storing in the overlay measuring apparatus an optimized ideal size for the reference fuse pattern, wherein the optimized ideal size is defined by optimizing the measured size of the reference fuse pattern in relation to an ideal fuse pattern size defined by a numerical value range;

measuring a size and a first Z-axial focus position of a top region of the reference fuse pattern;

storing the first Z-axial focus position in the overlay measuring apparatus;

measuring a size of the selected fuse pattern using stored reference information, wherein the stored reference data includes at least the first Z-axial focus position and the optimized ideal size for the reference fuse pattern;

determining whether the size of the selected fuse pattern is suitable relative to the stored reference data, and transferring data from the overlay measuring apparatus to a host computer in response to the determination of whether the size of the selected fuse pattern is suitable relative to the stored reference data, and storing the data in the host computer.

2. The method of claim 1, wherein upon determining that the size of the selected fuse pattern is not suitable relative to the stored reference data, the data transferred to the host computer comprises an undated specification for the Z-axial focus position.

3. The method of claim 2, wherein upon determining that the size of the selected fuse pattern is not suitable relative to the stored reference data, the method further comprises:

re-scanning the second wafer and performing a focus retraining;

following the refocus training, manually checking the Z-axial focus position; and forming the updated specification using the checked Z-axial focus position.

4. The method of claim 1, wherein the first scan range 20 μm.

5. The method of claim 1, wherein upon determining that the size of the selected fuse pattern is suitable relative to the stored reference data, the data transferred to the host computer comprises measured coordinates for the selected fuse pattern.

* * * * *